United States Patent [19]
Michail et al.

[11] Patent Number: 5,825,245
[45] Date of Patent: Oct. 20, 1998

[54] COMPOUND CASCODE AMPLIFIER

[75] Inventors: Michel S. Michail, South Burlington, Vt.; Wilbur David Pricer, Charlotte, Conn.

[73] Assignee: International Business Machines Corporation, Armonk, N.Y.

[21] Appl. No.: 855,602

[22] Filed: May 13, 1997

[51] Int. Cl.$^6$ ............................................ H03F 3/45
[52] U.S. Cl. ............................................ 330/253; 330/311
[58] Field of Search .................................... 330/253, 301, 330/310, 311, 277

[56] References Cited

U.S. PATENT DOCUMENTS

| | | | |
|---|---|---|---|
| 4,797,631 | 1/1989 | Hsu et al. | 330/253 |
| 4,937,476 | 6/1990 | Bazes | 307/475 |
| 5,323,121 | 6/1994 | Butler | 330/252 |
| 5,337,008 | 8/1994 | Badyal | 330/253 |
| 5,420,540 | 5/1995 | Butler | 330/255 |

FOREIGN PATENT DOCUMENTS

| 0170707 | 7/1990 | Japan | 330/253 |
|---|---|---|---|

Primary Examiner—Robert J. Pascal
Assistant Examiner—Khanh Van Nguyen
Attorney, Agent, or Firm—Scully, Scott, Murphy and Presser

[57] ABSTRACT

A compound cascode amplifier comprising first and second FET input transistors, the gates of which are coupled to a differential input, and first and second FET cascode transistors. The sources of the first and second cascode transistors are coupled respectively to the drains of the first and second input transistors. The gate of the first cascode transistor is coupled to a reference voltage V Ref. The drain of the first cascode transistor is coupled to the gate of the second cascode transistor, and the drain of the second cascode transistor forms the output of the circuit. In operation the drive to the gate of the second cascode transistor arrives in synchronization with the drive to the source thereof, such that the drive to the gate arrives in anticipation of a voltage swing at the output of the second cascode transistor amplifier, not in reaction to it. Accordingly, this arrangement does not introduce a delay or an additional pole in the frequency response of the circuit. A more detailed embodiment of the compound cascode amplifier further includes first and second complementary FET input transistors, and first and second complementary FET cascode transistors.

19 Claims, 8 Drawing Sheets

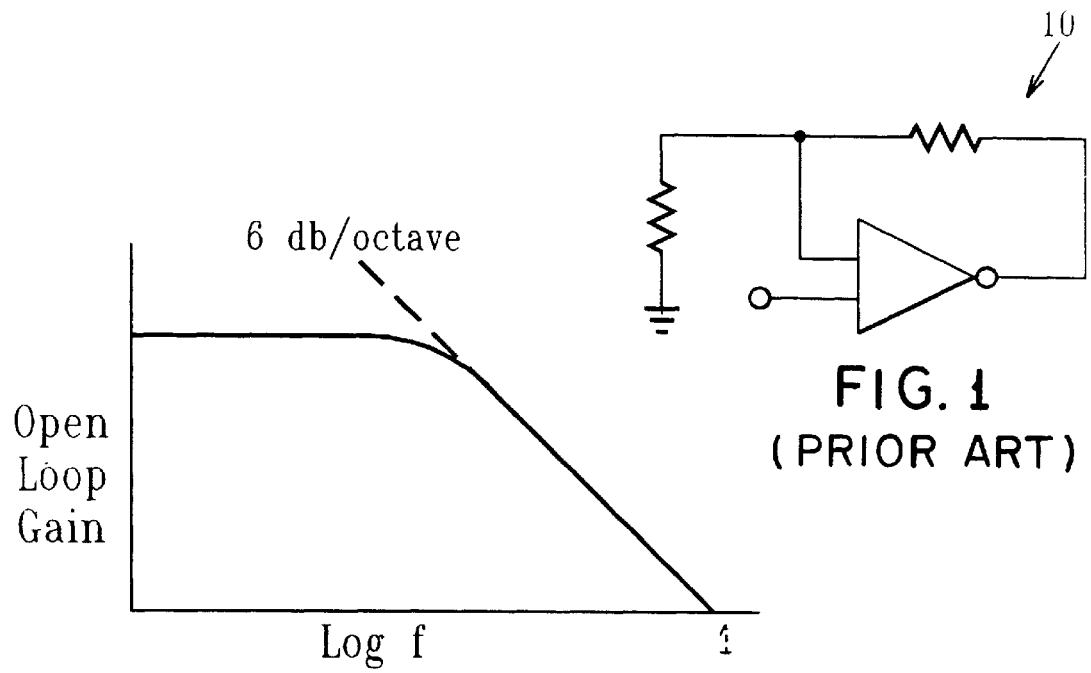
FIG. 1 (PRIOR ART)
FIG. 1A
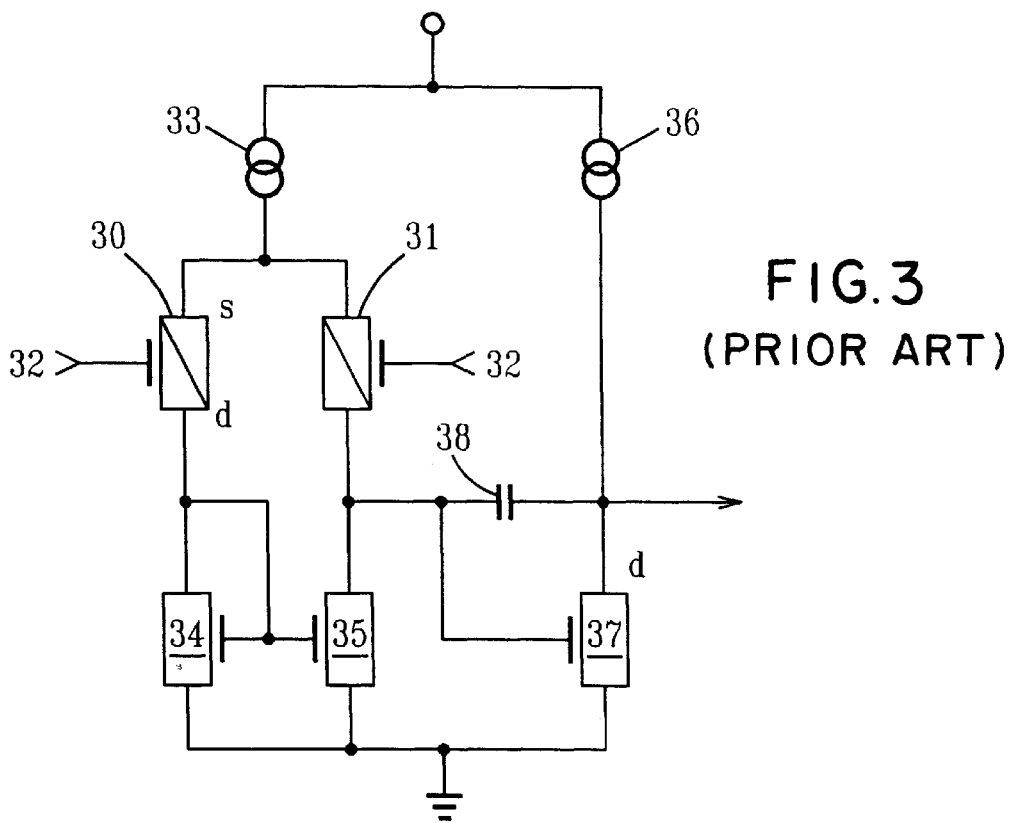
FIG. 3 (PRIOR ART)

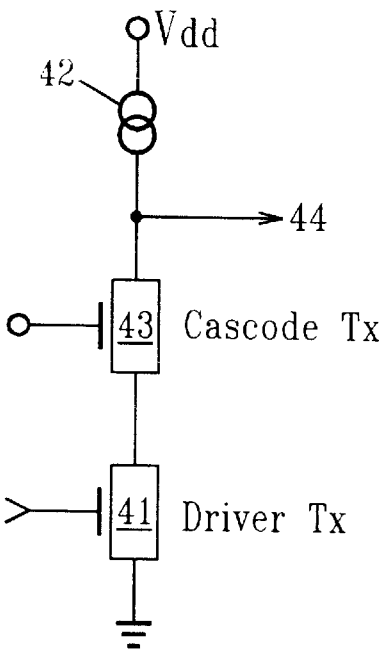
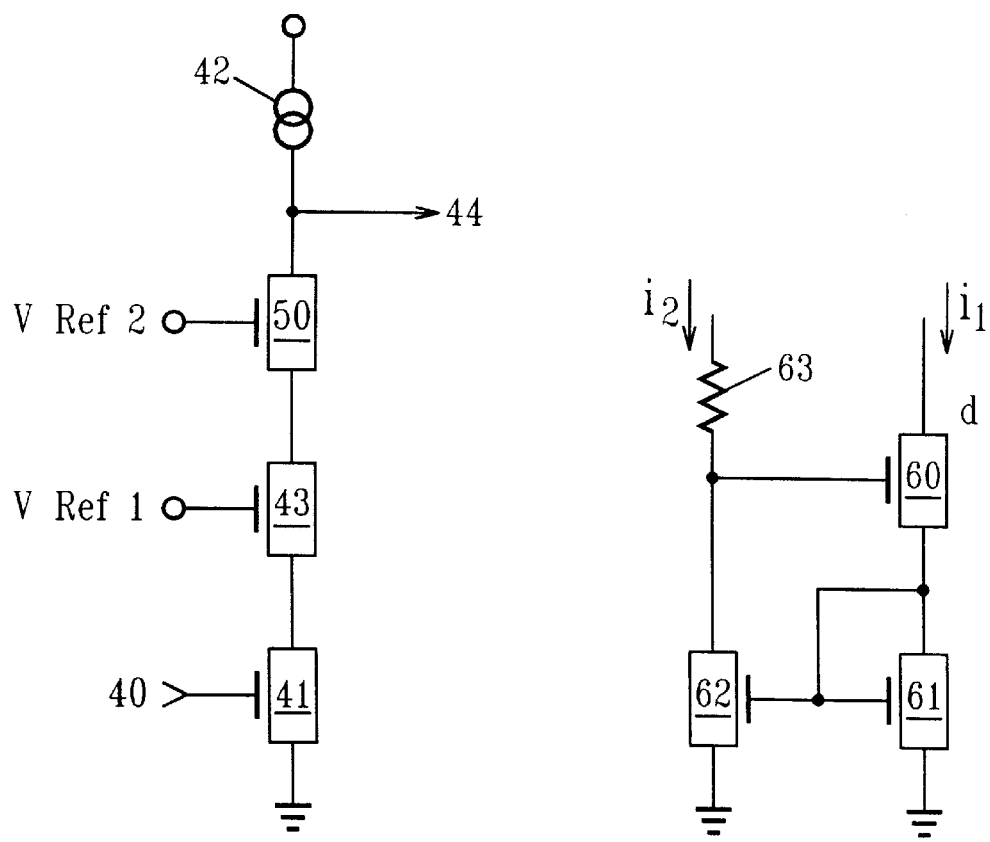
FIG. 4 (PRIOR ART)
FIG. 5 (PRIOR ART)
FIG. 6 (PRIOR ART)

5,825,245

COMPOUND CASCODE AMPLIFIER

BACKGROUND OF THE INVENTION

1. Field of the Invention

The present invention relates generally to a compound cascode amplifier, and more particularly pertains to a compound cascode amplifier which produces a very high voltage gain with a single stage inverter, which is achieved without compromising the unity gain point of the amplifier.

2. Discussion of the Art

Prior art operational amplifiers (op amps) are typically designed so that they exhibit a single pole in their transfer characteristic, with frequency response rolling off at a constant 6 db per octave, as illustrated by the idealized transfer characteristic shown in FIG. 1A, which is a plot of the open loop gain of the operational amplifier versus the log of the frequency. An operational amplifier with the transfer characteristics depicted in FIG. 1A which minimizes phase shift at higher frequencies can be connected in a variety of feedback configurations, such as FIG. 1, without danger of unwanted oscillations.

The most commonly used bipolar operational amplifiers readily accomplish this goal using a single inverter stage, which provides all or almost all of the needed voltage gain.

FIG. 2 is a schematic circuit of the 741 circuit, a classical and still very popular bipolar operational amplifier. It should be noted that although many transistors (twenty) are used in this prior art circuit design having a single inverter stage, only three transistors (a Darlington driver (Q16, Q17) and a current source load (Q13)) account for almost all of the voltage gain in this circuit. This design approach incorporates a high voltage process, with a large "Early Voltage". As is known in this art, this term refers to a figure of merit for bipolar transistors, which characterizes the flatness of the collector current as a function of the collector voltage. The Early Voltage refers to the voltage at which the extrapolated collector current crosses the abscissa where collector current equals zero. A large Early voltage serves to maximize the output impedance of the driver transistor.

The same goal is not so easy to accomplish with field effect transistors (FETs) for two reasons. First, the transconductance of FETs is lower than that of bipolar transistors. Secondly, the drain output impedance of FETs is lower than that for bipolars. Structural changes to the FET to make its drain output impedance higher, such as lengthening the channel, make the transconductance lower. So no satisfactory trade-offs exist within the FET device design for improving single stage gain.

Where high gain is desired, the FET designer can choose from a selection of classical solutions. The FET designer may elect to achieve the gain by cascading two or more gain stages, each with a typical voltage gain of 50–100. A typical prior art design approach is to load one stage with extra capacitance and use pole splitting to achieve the desired frequency roll-off. This results in a compromise with frequency response. However, in many instances the trade-off is warranted. This is a frequently used solution, and is illustrated by the circuit of FIG. 3.

The circuit of FIG. 3 has a first stage in which two p channel FETs 30,31 have a differential input at 32, the sources are connected to a current source 33, and the drains are connected to a current mirror load comprising two n channel FETs 34,35. In the second stage, a current source 36 is connected to the drain of an n channel FET 37, the gate of which is connected to the output of the first stage. A capacitor 38 is connected between the gate and drain of the n channel FET to increase the capacitance therebetween. The capacitor 38 splits the poles of the circuit, and reduces the overall frequency response, moving the circuit roll off to the left.

The FET designer can also elect to get the gain in a simple cascode inverter stage, as illustrated in FIG. 4. In this circuit, the input 40 is connected to the gate of an n channel FET driver transistor 41. A current source 42 is connected to the drain of an n channel FET cascode transistor 43, the gate of which is connected to a fixed reference voltage V Ref and the source of which is connected to the drain of the n channel FET 41. The drain of the cascode driver transistor 43 forms the circuit output at 44. In this circuit, the cascode transistor 43 prevents the drain of the driver transistor 41 from "seeing" the full voltage swing of the output at 44 and thus makes the driver transistor 41 a better current driver. This solution can increase the voltage gain by another 20–25X, such that if the voltage gain of the driver transistor alone is 50 and the cascade circuit increases the gain by 20, then the overall gain of the cascade circuit is now 1000. The cascade circuit has the disadvantage that the driver transistor 41 cannot drive "rail to rail" since the high gain region is limited by the cascode transistor 43, and particularly by the fixed reference voltage at its gate. The gain available from such a stage is still much less than that available from a single simple bipolar inverter. This solution is also widely used.

As a third alternative, the FET designer may elect to use a double cascode circuit, as illustrated in FIG. 5, which is similar to the circuit of FIG. 4, but adds a second cascade amplifier 50 having a second fixed reference voltage V Ref 2. This prior art design approach further protects the driver from "seeing" the full output voltage swing and thus makes for a higher gain stage. This solution is almost never used, especially in low voltage applications because it severely restricts the dynamic range of the output. To achieve really high output impedance the cascade transistors must be tied to different reference voltages at significant voltage differences from each other and the rails.

FIG. 6 illustrates another prior art circuit of background interest, the Wilson Current Source. The Wilson Current Source is often used in current mirrors, because the circuit is relatively unperturbed by voltage and temperature changes. The Wilson Current Source can be either N or P channel, and comprises three FETs 60, 61 and 62 connected as shown. Assume that the voltage at the drain of cascode transistor 60 is lowered, then the current i1 would decrease. This lowers the voltage at the source of cascode transistor 60 and also at the gate of transistor 62. This results in decreasing the current through transistor 62, and since transistor 62 and resistor 63 are arranged in a voltage divider network, the lower current through transistor 62 raises the voltage at the gate to transistor 60, to make transistor 60 conduct more to compensate for the lower voltage at its drain. The Wilson Current Source technique is never used in a cascode amplifier. The reason why is that the compensating signal at the gate of cascode transistor 60 lags the voltage drop at its drain. The additional feedback path introduces another pole into the circuit and thus results in an unacceptable phase shift at the amplifier output. The Wilson Current Source is, however, very effective in improving the output impedance of current mirrors.

The effective impedance of the current mirror is improved because the gate voltage of the cascode transistor is raised in response to any lowering of the transistor's source voltage.

SUMMARY OF THE INVENTION

Accordingly, it is a primary object of the present invention to provide a compound cascode amplifier.

A further object of the subject invention is the provision of a compound cascode amplifier which produces a very high voltage gain with a single stage inverter, which is achieved without compromising the frequency at which the unity gain point of the amplifier appears.

In accordance with the teachings herein, the present invention provides a compound cascode amplifier comprising first and second FET input transistors, the gates of which are coupled to a differential input, and first and second FET cascode transistors. The sources of the first and second cascode transistors are coupled respectively to the drains of the first and second input transistors. The gate of the first cascode transistor is coupled to a reference voltage V Ref. The drain of the first cascode transistor is coupled to the gate of the second cascode transistor, and the drain of the second cascode transistor forms the output of the circuit.

In greater detail, in operation the drive to the gate of the second cascode transistor arrives in synchronization with the drive to the source thereof, such that the drive to the gate arrives in anticipation of a voltage swing at the output of the second cascode transistor amplifier, not in reaction to it. Accordingly, this arrangement does not introduce a delay or an additional pole in the frequency response of the circuit.

In a typical arrangement, the drains of the first and second input transistors are coupled respectively to first and second current sources, such that the sources of the first and second cascode transistors are also coupled respectively to the first and second current sources. The sources of the first and second input transistors are coupled in common to a third current source. The drains of the first and second cascode transistors are coupled respectively to fourth and fifth current sources.

A more detailed embodiment of the compound cascode amplifier further includes first and second complementary p channel FET input transistors, the gates of which are coupled to the differential input, which are coupled as complements to the first and second n channel FET input transistors. It also includes first and second complementary n channel FET cascode transistors, which are coupled as complements to the first and second p channel FET cascode transistors. The sources of the first and second complementary n channel FET cascode transistors are coupled respectively to the drains of the first and second complementary p channel input transistors. The gate of the first complementary cascode transistor is coupled to a reference voltage V Ref 2. The drain of the first complementary cascode transistor is coupled to the gate of the second complementary cascode transistor, and the drain of the second complementary cascode transistor is coupled to the output of the circuit.

In further detail, the drains of the first and second n channel input transistors are coupled to first and second current sources, and the drains of the first and second complementary input transistors are coupled to first and second complementary current sources.

The sources of the first and second p channel cascode transistors are also coupled to the first and second current sources, and the sources of the first and second complementary cascode transistors are also coupled to the first and second complementary current sources. The sources of the first and second n channel input transistors are coupled in common to a third current source, and the sources of the first and second complementary input transistors are coupled in common to a third complementary current source. The drains of the first and second p channel cascode transistors are coupled respectively to the drains of the first and second complementary n channel cascode transistors. The drains of the first cascode transistor and the first complimentary transistor are coupled through a circuit element for producing a voltage difference.

In one embodiment, each of the first and second current sources and each of the first and second complementary current sources includes a current mirror. Another embodiment includes an additional first p channel FET cascode transistor arranged in a double cascode, and an additional first complementary n channel FET cascode transistor arranged in a double cascode. In a further embodiment, the drains of the first p channel FET cascode transistor and the complementary first n channel FET cascode transistor are connected by a floating voltage source.

BRIEF DESCRIPTION OF THE DRAWINGS

The foregoing objects and advantages of the present invention for a compound cascode amplifier may be more readily understood by one skilled in the art with reference being had to the following detailed description of several preferred embodiments thereof, taken in conjunction with the accompanying drawings wherein like elements are designated by identical reference numerals throughout the several views, and in which:

FIG. 1 illustrates a typical prior art operational amplifier circuit wired in negative feedback for fixed gain.

FIG. 1A is an idealized transfer characteristic for the operational amplifier of FIG. 1. The plot is for the open loop gain of the operational amplifier versus the log of the frequency. The amplifier exhibits a single pole in its transfer characteristic, with frequency response rolling off at a constant 6 db per octave.

FIG. 3 illustrates a typical prior art design for an FET amplifier wherein one stage is loaded with extra capacitance and pole splitting is used to achieve a desired frequency roll-off.

FIG. 4 illustrates a prior art design for an FET amplifier wherein the gain is achieved in a simple cascode inverter stage.

FIG. 5 illustrates a prior art design which uses a double cascode circuit, which protects the driver transistor from seeing the full output voltage swing and thus makes for a higher gain stage.

FIG. 6 illustrates another prior art circuit, the Wilson Current Source, as is often used in current mirrors, because the circuit is relatively unperturbed by voltage and temperature swings.

DETAILED DESCRIPTION OF THE DRAWINGS

Figure 2:
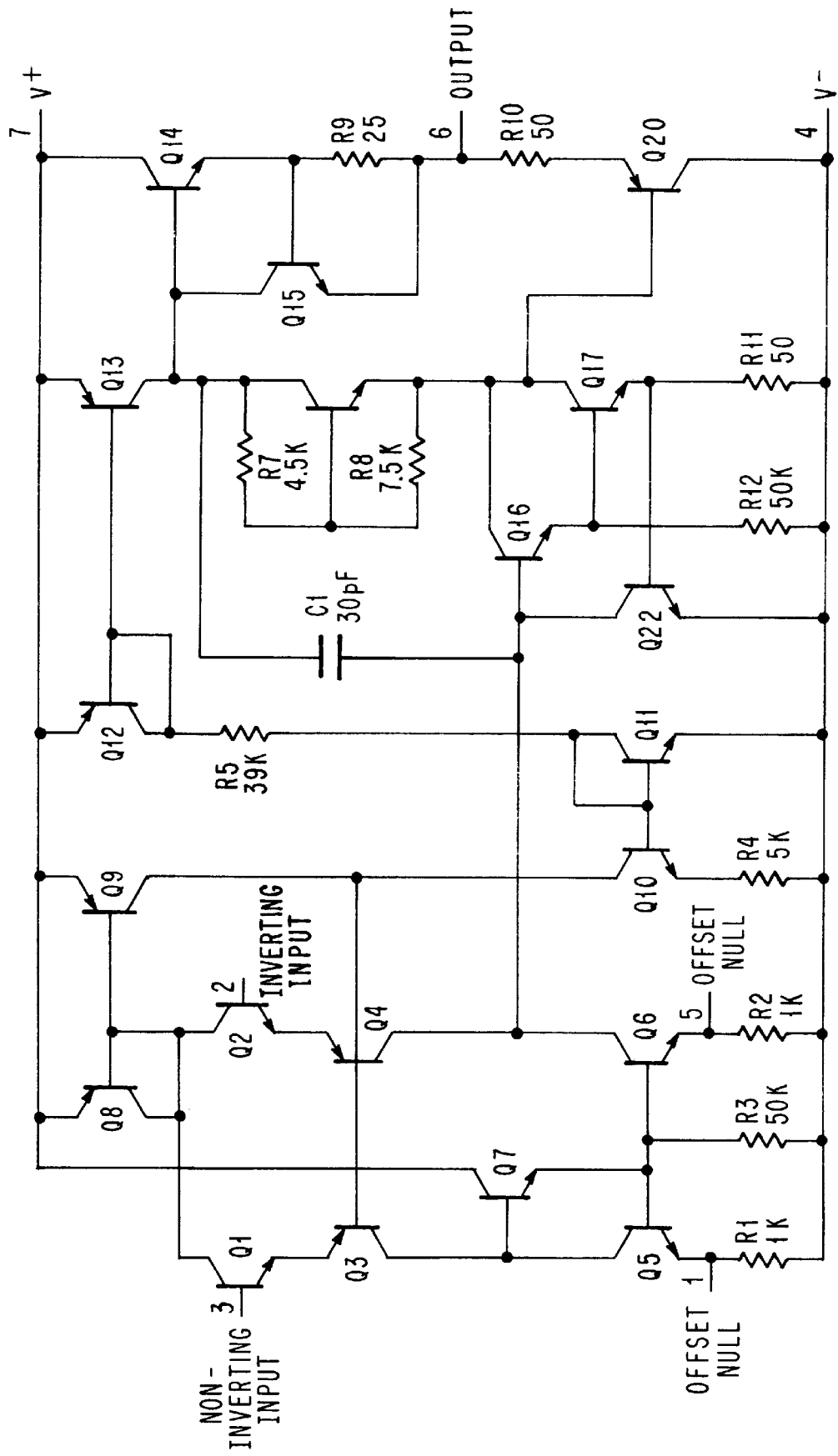
FIG. 2 is a schematic circuit of the 741 circuit, a classical and very popular operational amplifier.
Figure 7:
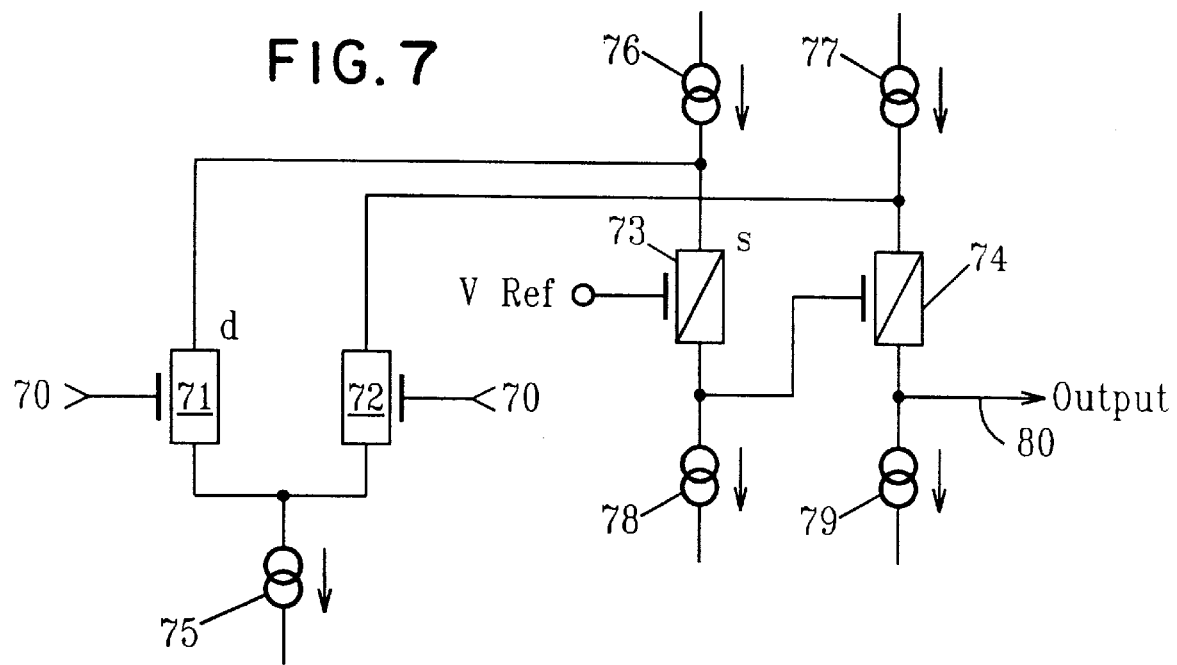
FIG. 7 illustrates a simple embodiment of compound cascode amplifier pursuant to the present invention.

FIG. 7 illustrates the approach of the present invention. For reasons which will be explained hereinbelow, the compound cascode amplifier of the present invention is best implemented with complementary pairs of differential input transistors, and FIG. 7 shows only one such pair of differential input transistors.

FIG. 7 illustrates a differential input at 70 to a pair of n channel FET input transistors 71,72, the drains of which are connected to the sources of a pair of p channel FET cascode transistors 73,74, and also to a pair of current sources 76,77. The sources of the input transistors 71,72 are connected in common to a single current source 75. The sources of the cascode transistors 73,74 are also connected to the pair of current sources 76,77. The drains of the cascode transistors 73, 74 are connected to a second pair of current sources 78,79. The gate of the first cascode transistor 73 is connected to a reference voltage V Ref. The drain of the first cascode transistor 73 is connected to the gate of the second cascode transistor 74, and the drain of the second cascode transistor forms the output of the circuit at 80.

The embodiment of FIG. 7 illustrates n channel FET input transistors and p channel FET cascode transistors. A complementary embodiment having p channel FET input transistors and n channel FET cascode transistors is equally functional and applicable.

The compound cascode amplifier of the present invention is similar to another common design, the "folded cascode" circuit. In the folded cascode circuit, the outputs of a pair of differential input transistors feed directly into the sources of two cascode transistors. Appropriate current biases are provided by current sources (current mirrors). In a typical folded cascode circuit, the first cascode transistor feeds a current mirror, or a cascode current mirror, which acts as a load for the second cascode transistor.

In contrast thereto, in the present invention, the first cascode transistor 73 feeds the gate of the second cascode transistor 74, rather than functioning as a load for the second cascode transistor.

The effect on the output impedance of the second cascode transistor 74 is similar to that of the Wilson Current Source with one important difference. The drive to the gate of the second cascode transistor 74 arrives in synchronization with the drive to the source thereof. The drive to the gate thus arrives in 'anticipation' of a voltage swing at the output of the amplifier, NOT in reaction to it. The circuit of the present invention does not introduce any additional delay, and thereby does not introduce an additional pole in the frequency response.

Figure 8:
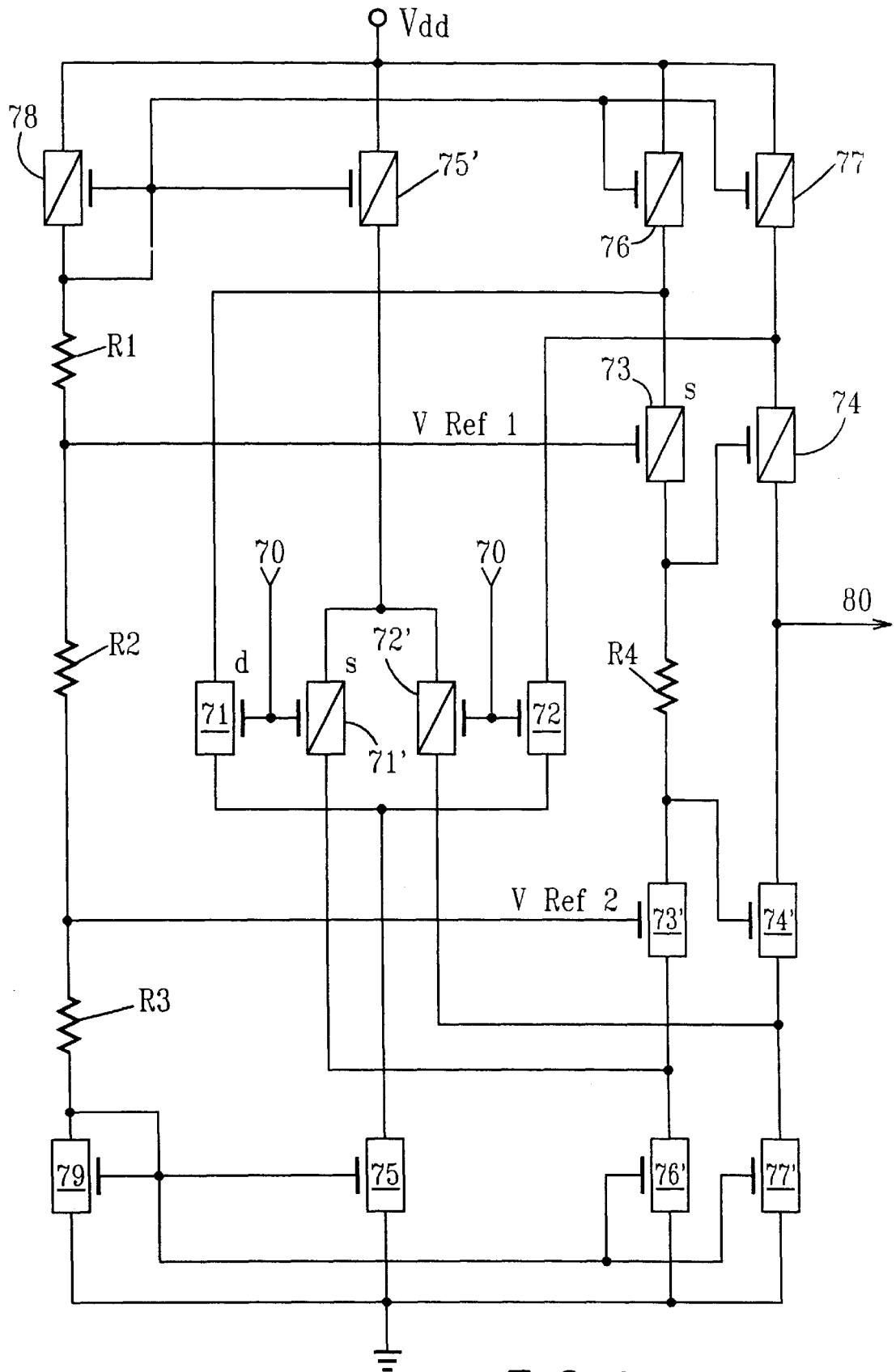
FIG. 8 illustrates a typical full embodiment of a compound cascode amplifier pursuant to the teachings of the present invention.

FIG. 8 illustrates a typical full embodiment of the compound cascode amplifier of the present invention. The embodiment of FIG. 8 is similar to the circuit of FIG. 7, with similar numbered components, and wherein the additions of complementary components are labeled with a prime (') number. The incorporation of complementary input differential pairs ( 71,71' and 72, 72') allows a push pull output drive without resort to elaborate current mirrors. This form of input circuit also has other advantages which are not part of the present invention.

The left side of the circuit of FIG. 8 is a bias network to provide the correct bias voltages to actuate the circuit to the right thereof as described hereinabove. The bias network is generally well known in the art and includes a p channel FET 78, three resistors R1, R2, and R3 connected in a voltage divider circuit, and an n channel FET 79.

Figure 9:
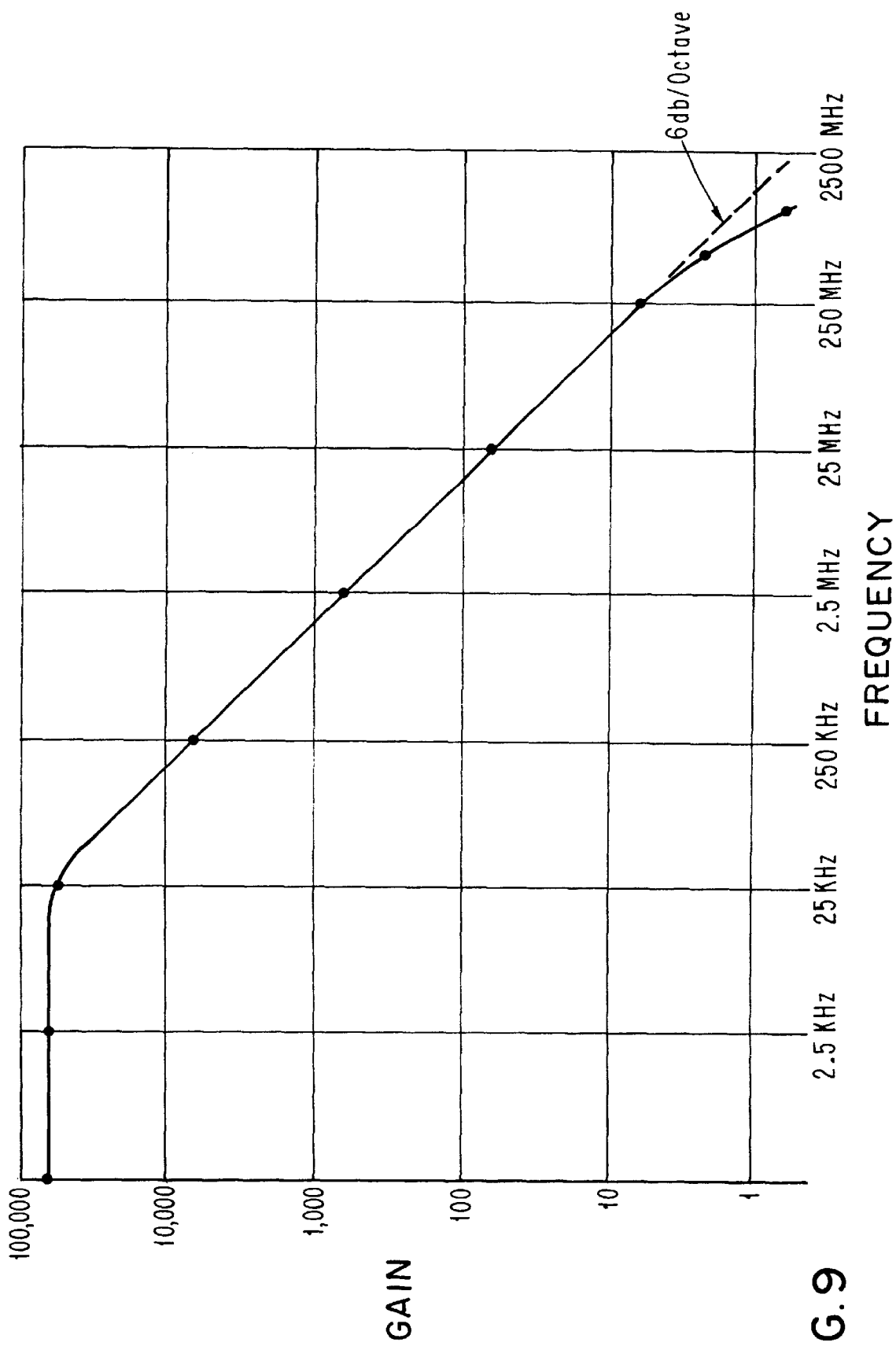
FIG. 9 illustrates the modeled frequency response of the compound cascode amplifier circuit, which evidences a smooth roll-off in frequency response, the signature of a single pole transfer characteristic.

The compound cascode amplifier circuit has been modeled using an ASTAP circuit analysis program with submicron FET device models. FIG. 9 illustrates the frequency response thereof, which evidences a smooth roll-off in frequency response, the signature of a single pole transfer characteristic.

The simulated amplifier achieved very high gain 65,000–98,000 for a single inverter stage. This is very nearly equal to the gain (typically 100,000) obtained in bipolar operational amplifiers.

The designers of the present invention have made an intentional design choice which should be noted and explained. The quiescent gate voltages of all the cascade transistors have been chosen to be very close to the quiescent gate voltage of their current source drivers. The voltage difference in this simulation is 450 mv. The choice was made to achieve wide dynamic range at the output. This is a trade-off with open loop gain. The quoted gain was achieved with this wide dynamic range trade-off.

Figure 10:
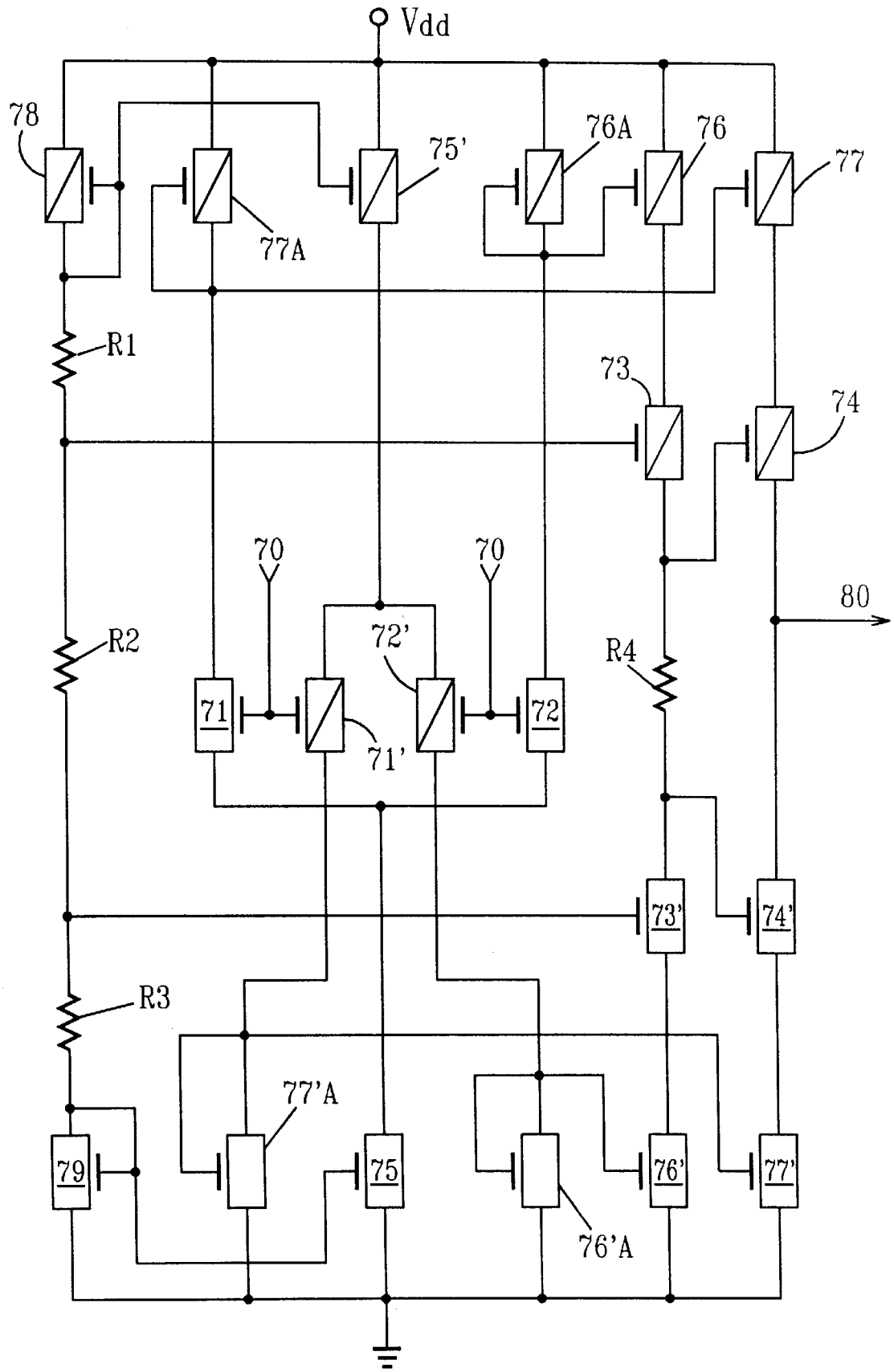
FIG. 10 illustrates an alternative embodiment of the compound cascode amplifier of the present invention wherein current mirrors are inserted in the signal path.

FIGS. 10 illustrates an alternative embodiment of the compound cascode amplifier of the present invention wherein current mirrors 76A with 76, 77A with 77, 76'A with 76' and 77'A with 77' are inserted in the signal path.

Figure 11:
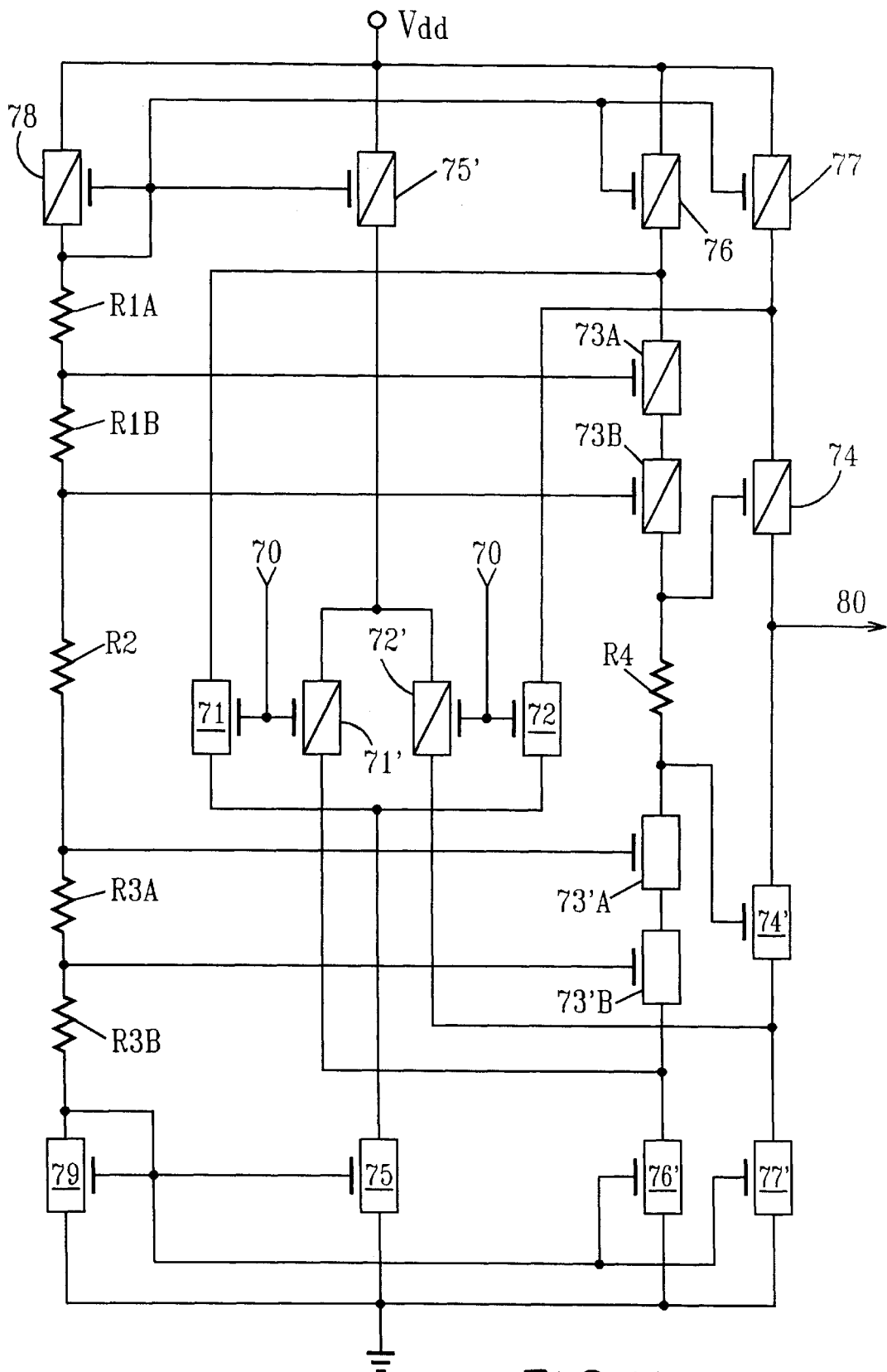
FIG. 11 illustrates a further embodiment of the compound cascode amplifier with a double cascode design.

FIG. 11 illustrates a further embodiment of the compound cascode amplifier of the present invention with a double cascode design, with double cascodes 73A, 73B and 73'A, 73'B, and double biasing resistors R1A, R1B and R3A, R3B.

Figure 12:
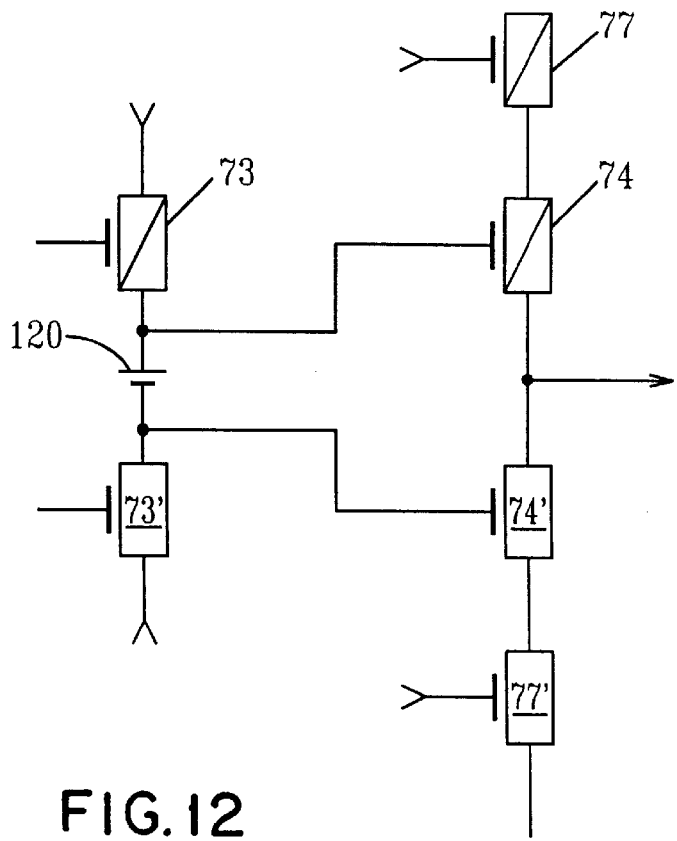
FIG. 12 illustrates an alternative embodiment of the compound cascode amplifier which utilizes a floating voltage source.

FIG. 12 illustrates an alternative embodiment of the compound cascode amplifier of the present invention which utilizes a floating voltage source 120 in place of resistor R4.

While several embodiments and variations of the present invention for a compound cascode amplifier are described in detail herein, it should be apparent that the disclosure and teachings of the present invention will suggest many alternative designs to those skilled in the art.

Having thus described our invention, what we claim as new, and desire to secure by Letters Patent is:

1. A compound cascode amplifier comprising:
   a. first and second FET input transistors, the gates of which are coupled to a differential input;
   b. first and second FET cascode transistors, the sources of which are coupled respectively to the drains of the first and second input transistors, the gate of the first cascode transistor is coupled to a reference voltage V Ref, the drain of the first cascode transistor is coupled to the gate of the second cascode transistor, and the drain of the second cascode transistor forms the output of the circuit.

2. A compound cascode amplifier as claimed in claim 1, wherein the drive to the gate of the second cascode transistor arrives in synchronization with the drive to the source of the second cascode transistor, such that the drive to the gate arrives in anticipation of a voltage swing at the output of the second cascode transistor amplifier, not in reaction to it, which does not introduce a delay or an additional pole in the frequency response of the circuit.

3. A compound cascode amplifier as claimed in claim 1, wherein the drains of the first and second input transistors are coupled respectively to first and second current sources, such that the sources of the first and second cascode transistors are also coupled respectively to the first and second current sources.

4. A compound cascode amplifier as claimed in claim 3, wherein the sources of the first and second input transistors are coupled in common to a third current source.

5. A compound cascode amplifier as claimed in claim 4, wherein the drains of the first and second cascode transistors are coupled respectively to fourth and fifth current sources.

6. A compound cascode amplifier as claimed in claim 5, wherein the first and second FET input transistors comprise n channel FET transistors, and the first and second FET cascode transistors comprise p channel FET transistors.

7. A compound cascode amplifier as claimed in claim 1, wherein the sources of the input transistors are coupled in common to a current source.

8. A compound cascode amplifier as claimed in claim 1, wherein the drains of the first and second cascode transistors are coupled to separate current sources.

9. A compound cascode amplifier as claimed in claim 1, wherein the first and second FET input transistors comprise n channel FET transistors, and the first and second FET cascode transistors comprise p channel FET transistors.

10. A compound cascode amplifier as claimed in claim 1, further including:
 a. first and second complementary FET input transistors which are coupled as complements to the first and second FET input transistors, and the gates of which are coupled to the differential input;
 b. first and second complementary FET cascode transistors which are coupled as complements to the first and second FET cascode transistors, the sources of which are coupled respectively to the drains of the first and second complementary input transistors, the gate of the first complementary cascode transistor is coupled to a second reference voltage V Ref 2, the drain of the first complementary cascode transistor is coupled to the gate of the second complementary cascode transistor, and the drain of the second complementary cascode transistor is coupled to the output of the circuit.

11. A compound cascode amplifier as claimed in claim 10, wherein the drains of the first and second input transistors are coupled to first and second current sources, and the drains of the first and second complementary input transistors are coupled to first and second complementary current sources, such that the sources of the first and second cascode transistors are also coupled to the first and second current sources, and the sources of the first and second complementary cascode transistors are also coupled to the first and second complementary current sources.

12. A compound cascode amplifier as claimed in claim 11, wherein each of the first and second current sources and each of the first and second complementary current sources includes a current mirror.

13. A compound cascode amplifier as claimed in claim 11, wherein the sources of the first and second input transistors are coupled in common to a third current source, and the sources of the first and second complementary input transistors are coupled in common to a third complementary current source.

14. A compound cascode amplifier as claimed in claim 13, wherein the drains of the first and second cascode transistors are coupled respectively to the drains of the first and second complementary cascode transistors.

15. A compound cascode amplifier as claimed in claim 10, wherein the first and second input transistors comprise n channel FET transistors, the first and second complementary input transistors comprise p channel FET transistors, the first and second cascode transistors comprise p channel FET transistors and the first and second complementary cascode transistors comprise n channel FET transistors.

16. A compound cascode amplifier as claimed in claim 10, further including an additional first FET cascode transistor arranged in a double cascode, and an additional first complementary FET cascode transistor arranged in a double cascode.

17. A compound cascode amplifier as claimed in claim 10, wherein the first cascode transistor and the complementary first cascode transistor are connected by a circuit element for producing a voltage difference.

18. A compound cascode amplifier as claimed in claim 10, wherein the first cascode transistor and the complementary first cascode transistor are connected by a floating voltage source.

19. A compound cascode amplifier as claimed in claim 10, wherein the first cascode transistor and the complementary first cascode transistor are connected by a resistor.

* * * * *

UNITED STATES PATENT AND TRADEMARK OFFICE
CERTIFICATE OF CORRECTION

PATENT NO. : 5,825,245
DATED : October 20, 1998
INVENTOR(S) : Wilbur D. Pricer, et al.

It is certified that error appears in the above-identified patent and that said Letters Patent is hereby corrected as shown below:

On the Title Page, item [75], line 3: "Conn." should read --Vt.--

Column 3, line 34: "cascade" should read --cascode--

Column 4, line 17: "cascade" should read --cascode--

Column 6, line 1: "cascade" should read --cascode--

Signed and Sealed this

Twelfth Day of October, 1999

Attest:

Q. TODD DICKINSON

*Attesting Officer*   Acting Commissioner of Patents and Trademarks